(12) United States Patent
Subramanian et al.

(10) Patent No.: US 10,911,004 B2
(45) Date of Patent: Feb. 2, 2021

(54) SAMPLED MOVING AVERAGE NOTCH FILTER FOR RIPPLE REDUCTION IN CHOPPER STABILIZED OPERATIONAL AMPLIFIERS

(71) Applicant: TEXAS INSTRUMENTS INCORPORATED, Dallas, TX (US)

(72) Inventors: Anand Subramanian, Bangalore (IN); Anand Kannan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 44 days.

(21) Appl. No.: 16/450,101

(22) Filed: Jun. 24, 2019

(65) Prior Publication Data

US 2020/0119697 A1 Apr. 16, 2020

(30) Foreign Application Priority Data

Oct. 12, 2018 (IN) .............................. 201841038728

(51) Int. Cl.
*H03F 3/45* (2006.01)
*H03F 1/26* (2006.01)
(Continued)

(52) U.S. Cl.
CPC ................. *H03F 1/26* (2013.01); *H03F 1/34* (2013.01); *H03F 3/45071* (2013.01); *H03F 3/68* (2013.01);
(Continued)

(58) Field of Classification Search
CPC ....................................................... H03F 3/45
(Continued)

(56) References Cited

U.S. PATENT DOCUMENTS 3,697,891 A * 10/1972 Shade .................... H03K 4/066
332/113
4,801,888 A * 1/1989 Hague .................. H03H 19/004
330/107
(Continued)

OTHER PUBLICATIONS

"Circuit Techniques for Reducing the Effects of Op-Amp Imperfections: Autozeroing, Correlated Double Sampling, and Chopper Stabilization," by Christian C. Enz and Gabor C. Temes, Proceeding of the IEEE, vol. 84, No. 11, Nov. 1996, pp. 1584-1614.
(Continued)

*Primary Examiner* — Henry Choe
(74) *Attorney, Agent, or Firm* — John R. Pessetto; Charles A. Brill; Frank D. Cimino

(57) ABSTRACT

A chopper-stabilized amplifier includes a first transconductance amplifier and a first chopper circuit coupled to an input of the first transconductance amplifier. A second chopper circuit is coupled to an output of the first transconductance amplifier. The chopper-stabilized amplifier also includes second and third transconductance amplifiers having inputs coupled to the output of the first transconductance amplifier. The second transconductance amplifier produces an output responsive to a first notch clock signal having a first phase relative to the chopping of the second chopper circuit. The third transconductance amplifier produces an output responsive to a second notch clock signal having a second phase relative to the first phase. The output signals produced by the second and third transconductance amplifiers are added to filter ripple noise at the outputs of the second and third transconductance amplifiers.

13 Claims, 6 Drawing Sheets

(51) Int. Cl.
H03F 3/68 (2006.01)
H03F 1/34 (2006.01)

(52) U.S. Cl.
CPC .. *H03F 2200/129* (2013.01); *H03F 2200/252* (2013.01); *H03F 2200/375* (2013.01); *H03F 2200/421* (2013.01); *H03F 2200/459* (2013.01); *H03F 2203/45051* (2013.01); *H03F 2203/45111* (2013.01); *H03F 2203/45116* (2013.01); *H03F 2203/45152* (2013.01); *H03F 2203/45171* (2013.01); *H03F 2203/45226* (2013.01); *H03F 2203/45288* (2013.01); *H03F 2203/45512* (2013.01)

(58) Field of Classification Search
USPC .............................................. 330/9, 252, 69
See application file for complete search history.

(56) References Cited

U.S. PATENT DOCUMENTS

| | | | |
|---|---|---|---|
| 5,382,956 A | 1/1995 | Baumgartner et al. | |
| 5,663,680 A | 9/1997 | Nordeng | |
| 6,351,506 B1 | 2/2002 | Lewicki | |
| 7,132,883 B2 | 11/2006 | Huijsing et al. | |
| 7,202,738 B1 | 4/2007 | Huijsing et al. | |
| 7,292,095 B2 | 11/2007 | Burt et al. | |
| 2020/0091880 A1* | 3/2020 | Fan | H03F 3/45973 |

OTHER PUBLICATIONS

"Operational Amplifier, Theory and Design," by Johan Huijsing, Kluwer Academic Publishers, Boston, Copyright 2001, pp. 228-232.

"A 3u V-Offset Operational Amplifier With 20nV/Hz Input Noise PSD at DC Employing Both Chopping and Autozeroing," by Andrew T.K. Tang, ISSCC 2002/Session 23, Analog Techniques 23.4, 2002 IEEE International Solid-State Circuits Conference, Feb. 6, 2002, (2 pages).

* cited by examiner

SAMPLED MOVING AVERAGE NOTCH FILTER FOR RIPPLE REDUCTION IN CHOPPER STABILIZED OPERATIONAL AMPLIFIERS

CROSS REFERENCE TO RELATED APPLICATIONS

This application claims priority from Indian provisional application No. 201841038728, filed Oct. 12, 2018, entitled "CHOPPER RIPPLE ELIMINATION USING SAMPLED MOVING AVERAGE NOTCH FILTER", assigned to the present assignee and incorporated herein by reference.

BACKGROUND

The invention relates generally to reducing ripple noise in chopper stabilized operational amplifier circuits, and more particularly to sampled moving average notch filters for ripple noise reduction in chopper stabilized operational amplifier circuits.

DESCRIPTION OF THE RELATED ART

Chopper stabilization is used to reduce offset voltage, offset voltage drift and flicker noise in amplifiers. Chopper stabilized amplifiers maintain the noise charactersitics of their input stages, but shift their input offset voltages to the chopping frequency, creating large ripple noise at the amplifier outputs.

FIG. 1 illustrates a three-stage amplifier 100 with chopper stabilization circuitry. This circuit configuration includes a three-stage high gain signal path including three sequentially coupled operational transconductance amplifiers 104, 108 and 112 having transconductances of gm1, gm2, and gm3, respectively. The three-stage high gain signal path is coupled in parallel with a wider bandwidth two stage signal path including two sequentially coupled operational transconductance amplifiers 116 and 112 having transconductances of gm4 and gm3, respectively. A first chopper stabilization circuit 120 including switches S1, S2, S3, and S4 is added before stage 2 (i.e., input stage), and a second chopper stabilization circuit 124 including switches S5, S6, S7, and S8 is added after stage 2. The chopper stabilization reduces offset voltage, offset voltage drift, and flicker noise, but shifts the offset voltage of the input stage to the chopping frequency and thereby producing a large ripple noise in the amplifier output Vout.

In order to reduce ripple in the amplifier output, switched capacitor notch filters have been incorporated into amplifiers. FIG. 2A illustrates a three stage amplifier 200 including a switched capacitor notch filter circuit 204. The amplifier 200 is similar to the amplifier 100 except for the addition of the switched capacitor notch filter circuit 204 to the high gain signal path at the output of the second chopper stabilization circuit 124. The notch filter circuit 204 includes a sample and hold circuit controlled by a notch clock signal Fnotch. The switched capacitor notch filter operates at 90 degrees out of phase with a chopper clock Fs to filter out the ripple at the chopper frequency. FIG. 2B illustrates the ripple voltage Vripple, the chopper clock Fs and the notch clock signal Fnotch.

As shown in FIG. 2B, if the switched capacitor notch filter 204 is operated at precisely 90 degrees out of phase with the chopper clock Fs, ripple will be eliminated. If, however, there is a skew between the chopper clock Fs and the notch clock Fnotch, there remains a residual ripple. Thus, if the switched capacitor notch filter 204 is not operated at exactly 90 degrees out of phase with the chopper circuits, there remains a residual ripple Vripple as shown in FIG. 2C.

What is needed is a chopper-stabilized amplifier that does not require the generation of control signal that is precisely 90 degrees out of phase with the chopper clock and is tolerant of clock skew between the chopper clock and the notch filter clock.

SUMMARY

In accordance with one embodiment of the invention, a chopper-stabilized amplifier includes a first transconductance amplifier and a first chopper circuit coupled to an input of the first transconductance amplifier. The first chopper circuit is configured to chop an input signal to apply the chopped input signal to the input of the first transconductance amplifier. A second chopper circuit is coupled to an output of the first transconductance amplifier. The second chopper circuit is configured to chop an output of the first transconductance amplifier to produce a second chopped signal. A first and a second capacitor are coupled between an output of the second chopper circuit and ground. The chopper-stabilized amplifier also includes a second transconductance amplifier having an input coupled to receive the second chopped signal. The second transconductance amplifier produces an output responsive to a first notch clock signal having a first phase relative to the chopping of the second chopper circuit. The chopper-stabilized amplifier also includes a third transconductance amplifier having an input coupled to receive the second chopped signal. The third transconductance amplifier produces an output responsive to a second notch clock signal having a second phase relative to the first phase. The output signals produced by the second and third transconductance amplifiers are added to filter ripple voltages at the outputs of the second and third transconductance amplifiers. The chopper-stabilized amplifier also includes a fourth transconductance amplifier having an input coupled to receive the outputs of the second and third transconductance amplifiers. A compensation capacitor is coupled between the input and output of the fourth transconductance amplifier. The chopper-stabilized amplifier also includes a fifth transconductance amplifier having an input coupled to receive the input signal and an output coupled to the input of the fourth transconductance amplifier.

In accordance with another embodiment, a chopper-stabilized amplifier includes a first transconductance amplifier and a first chopper circuit coupled to an input of the first transconductance amplifier. The first chopper circuit is configured to chop an input signal to apply the chopped input signal to the input of the first transconductance amplifier. A second chopper circuit is coupled to an output of the first transconductance amplifier. The second chopper circuit is configured to chop an output of the first transconductance amplifier to produce a second chopped signal. A first and a second capacitor are coupled between an output of the second chopper circuit and ground. A sampled moving average notch filter having differential inputs is coupled to receive the second chopped signal. The sampled moving average notch fitler produces a first output responsive to a to a first notch clock signal having a first phase relative to the chopping of the second chopper circuit and a second output responsive to a second notch clock signal having a second phase relative to the first phase. The first and second outputs are added to filter ripple voltages at the outputs of the sampled moving average notch filter. The sampled moving average filter includes a second transconductance amplifier having differential inputs coupled to receive the second chopped signal and is operable to produce the first output responsive to the first notch clock signal. The sampled moving average notch filter includes a third transconductance amplifier having differential inputs coupled to receive the second chopped signal and is operable to produce the second output responsive to a second notch clock signal. The chopper-stabilized amplifier also includes a fourth transconductance amplifier having an input coupled to receive the outputs of the second and third transconductance amplifiers and a compensation capacitor coupled between the input and output of the fourth transconductance amplifier. The chopper-stabilized amplifier also includes a fifth transconductance amplifier having an input coupled to receive the input signal and an output coupled to the input of the fourth transconductance amplifier.

DETAILED DESCRIPTION

Figure 1:
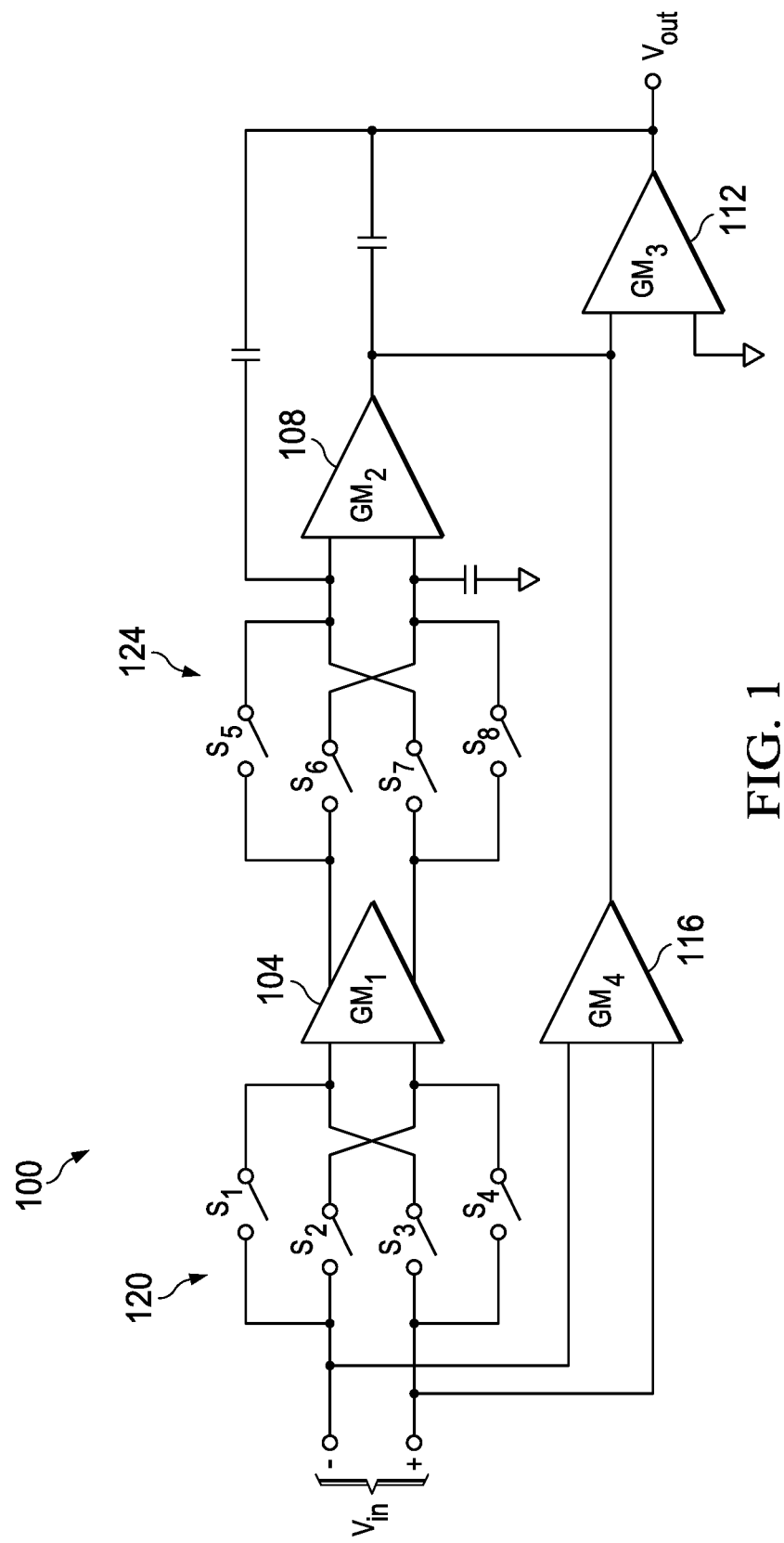
FIG. 1 illustrates a three-stage amplifier with chopper stabilization circuitry.
Figure 2A:
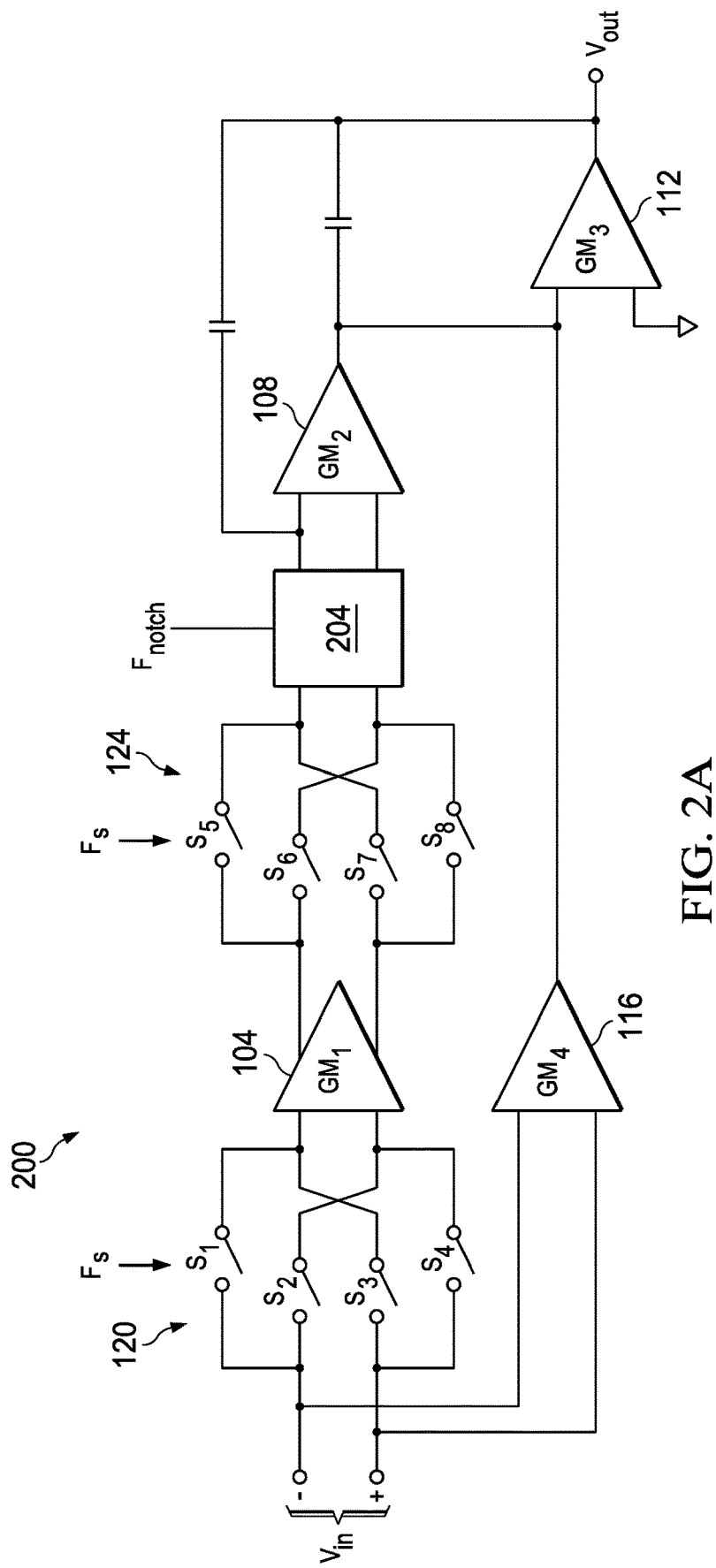
FIG. 2A illustrates a three stage amplifier including a switched capacitor notch filter circuit, and 2B and 2C show waveforms of signals produced by the amplifier.
Figure 2B:
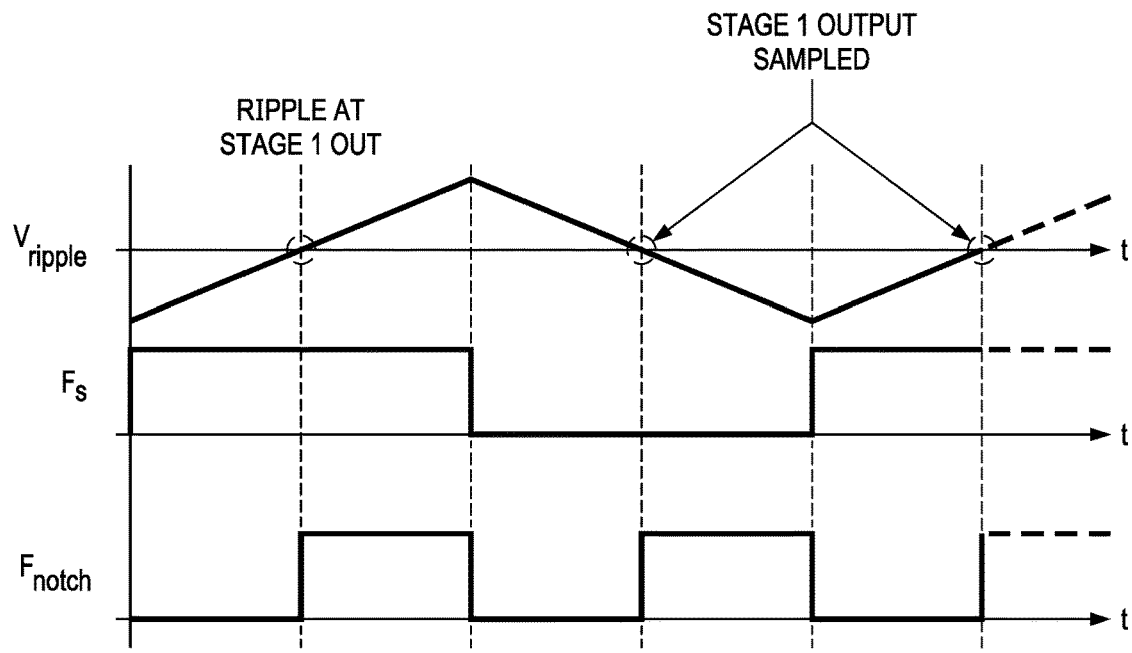
Figure 2C:
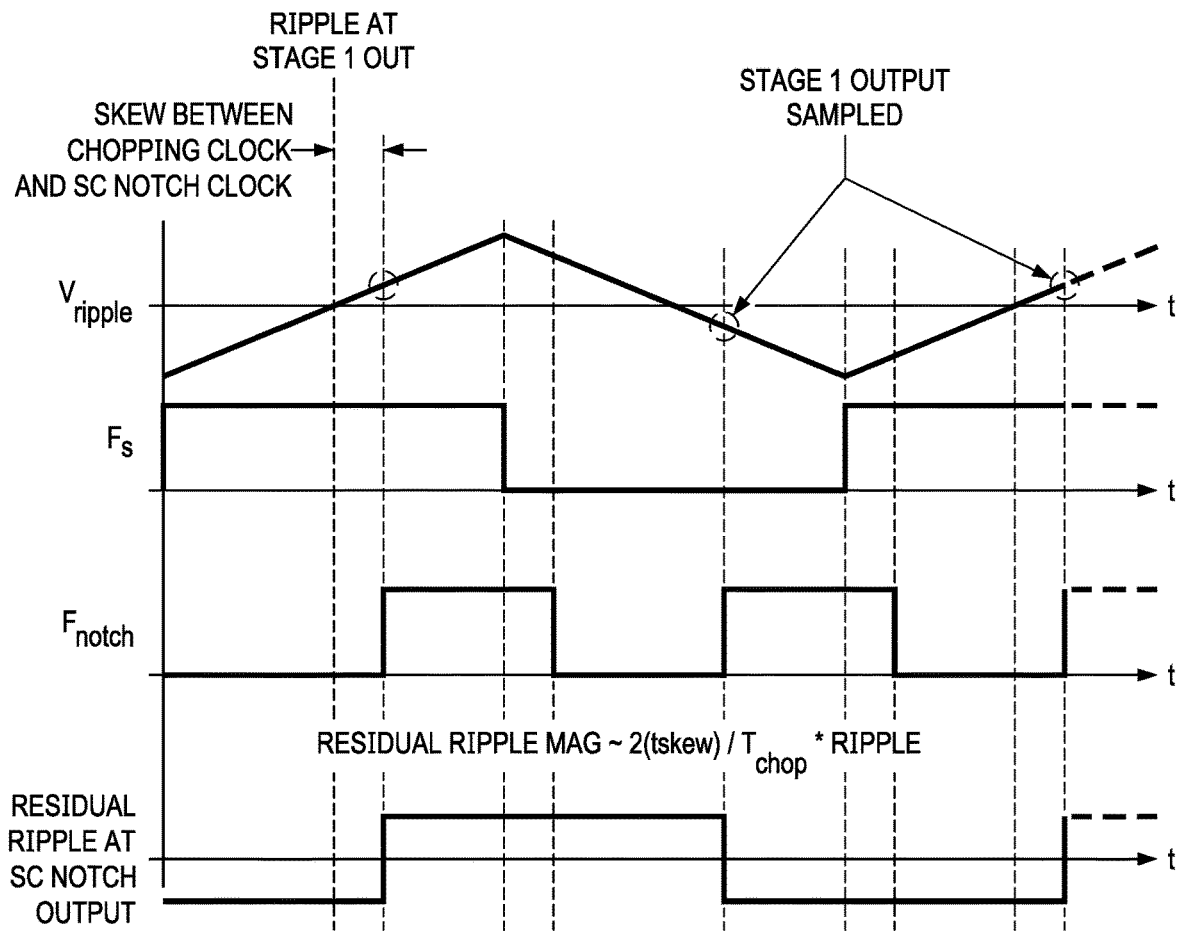

FIG. 3 A illustrates a chopper-stabilized amplifier 300 in accordance with the present disclosure. The amplifier 300 includes a first chopper circuit 304 between differential input voltages Vin− and Vin+ and the differential inputs of a first transconductance amplifier 308 having a transconductance gm1. The first chopper circuit 304 includes switches S1, S2, S3 and S4 which are controlled by phase 1 and phase 2 signals shown in FIG. 3B. Switches S1 and S4 are closed when phase 1 is high, and switches S2 and S3 are closed when phase 2 is high. The switches may be MOSFETs or other types of switches. The first chopper circuit 304 produces chopped input signals which are applied to the differential inputs of the first transconductance amplifier 308.

The amplifier 300 includes a second chopper circuit 312 connected to the differential outputs of the transconductance amplifier 308. The second chopper circuit 312 includes switches S5, S6, S7 and S8 which are also controlled by the phase 1 and phase 2 signals shown in FIG. 3B. Switches S5 and S8 are closed when phase 1 is high, and switches S6 and S7 are closed when phase 2 is high. The second chopper circuit 312 produces second chopped signals at the differential outputs of the second chopper circuit 312. The first and second chopper circuits 304 and 312 are operated synchronously at a chopping frequency Fs.

Capacitors 316 and 320 are coupled between the differential outputs of the second chopper circuit 312 and ground. Due to the chopping action, the output current of the second chopper circuit 312 has a square waveform which is integrated by the capacitors 316 and 320. As a result, triangular waveform voltages are generated across the capacitors 316 and 320.

The amplifier 300 includes a second transconductance amplifier 324 having a transconductance gm2. The second transconductance amplifier 324 includes differential inputs coupled to receive the second chopped signal. The second transconductance amplifier 324 also receives a clock signal F1. The second transconductance amplifier 324 produces an output signal responsive to the clock signal F1. The clock signal F1 has a first phase relative to the chopping of the chopper circuits. In some embodiments, F1 is in phase with Fs.

The amplifier 300 includes a third transconductance amplifier 328 having a transconductance gm3. According to some disclosed embodiments, gm2 is equal to gm3. The third transconductance amplifier 328 includes differential inputs coupled to receive the second chopped signal. The third transconductance amplifier 328 also receives a clock signal F2. The third transconductance amplifier 328 produces an output signal responsive to the clock signal F2. The clock signal F2 has a second phase relative to the chopping of the chopper circuits. In some embodiments, F2 is 180 degrees out of phase with Fs.

Since F1 and F2 are 180 degrees out of phase with each other, the input signals applied to the transconductance amplifiers 324 and 328 have same value in the rising direction and the falling direction (i.e., equal magnitude but opposite signs). Thus, ripple voltages in the inputs of the transconductance amplifiers 324 and 328 have the same positive and negative values. The output signals produced by the second and third transconductance amplifiers 324 and 328 are added at junction 326 to cancel ripple voltages. As discussed before, gm2 is equal to gm3, and as a consequence the ripple is canceled.

The amplifier 300 includes a fourth transconductance amplifier 332 having a transconductance gm4. The fourth transconductance amplifier 332 includes an input coupled to receive the outputs of the second and third transconductance amplifiers 324 and 328. A miller compensation capacitor 336 is coupled between the input and output of the fourth transconductance amplifier 332. The transconductance amplifier 332 produces an output voltage Vout.

The amplifier 300 includes a fifth transconductance amplifier 340 having a transconductance gm5. The fifth transconductance amplifier 340 includes differential inputs coupled to receive the input signals and an output coupled to the input of the fourth transconductance amplifier 336. Thus, the amplifier 300 provides a high gain signal path including four transconductance amplifiers 308, 324, 328 and 336 having transconductances of gm1, gm2, gm3, and g4 respectively. The high gain signal path is coupled in parallel with a wider bandwidth signal path including two sequentially coupled transconductance amplifiers 340 and 336 having transconductances of gm5 and gm4, respectively.

Figure 3A:
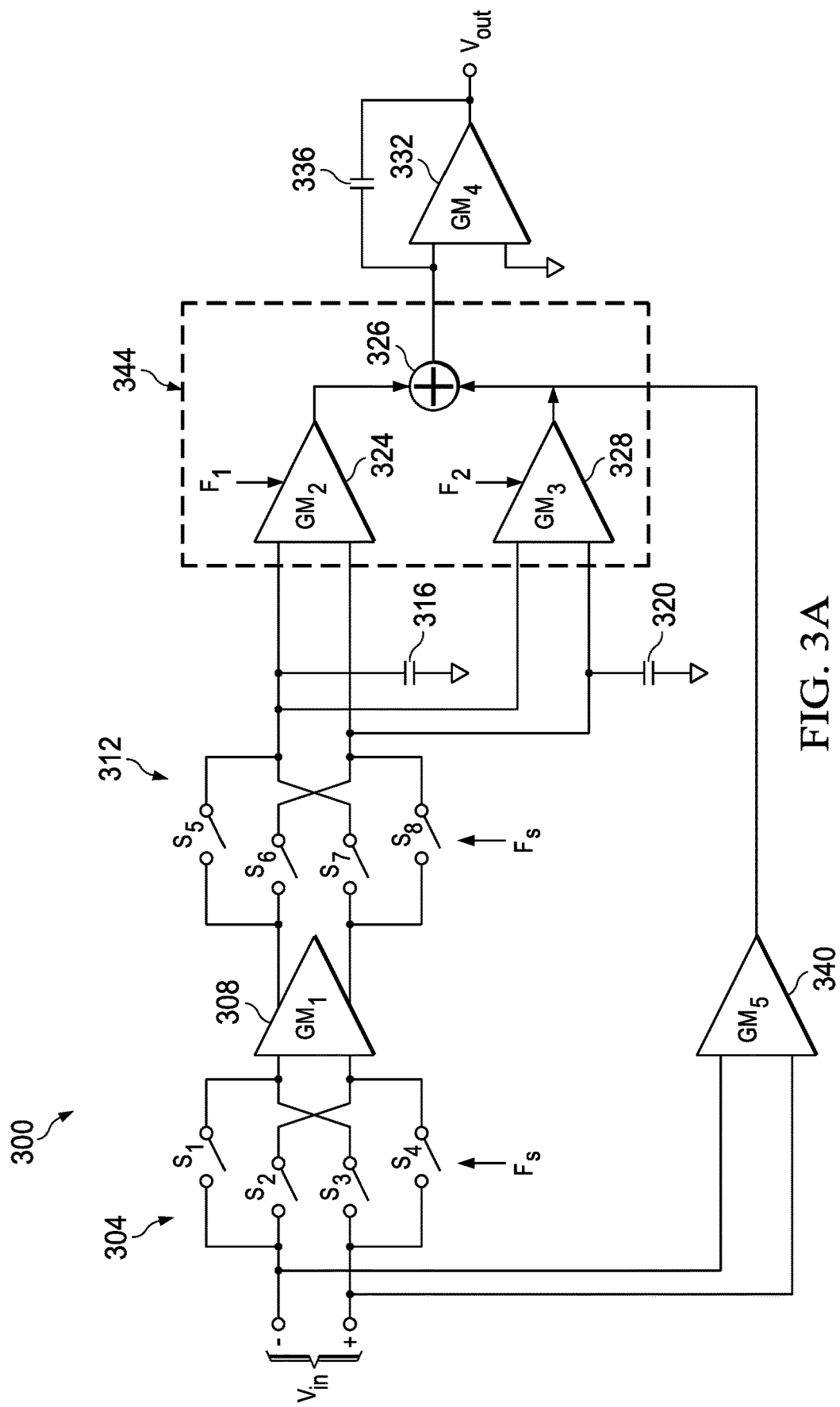
FIG. 3A illustrates a chopper-stabilized amplifier in accordance with the present disclosure.
Figure 3B:
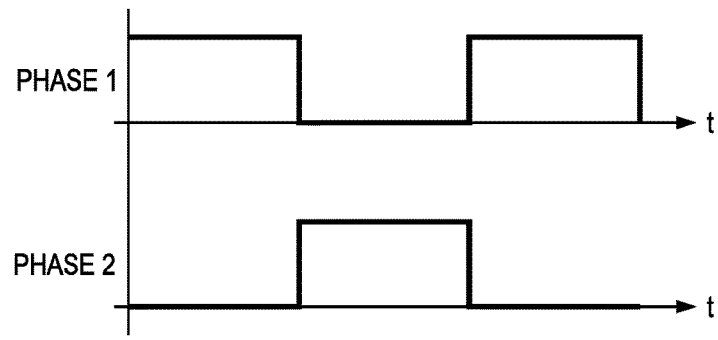
FIG. 3B is a timing diagram for the chopper-stabilized amplifier of FIG. 3A, and FIGS. 3C and 3D show waveforms of signals produced by the amplifier.
Figure 3C:
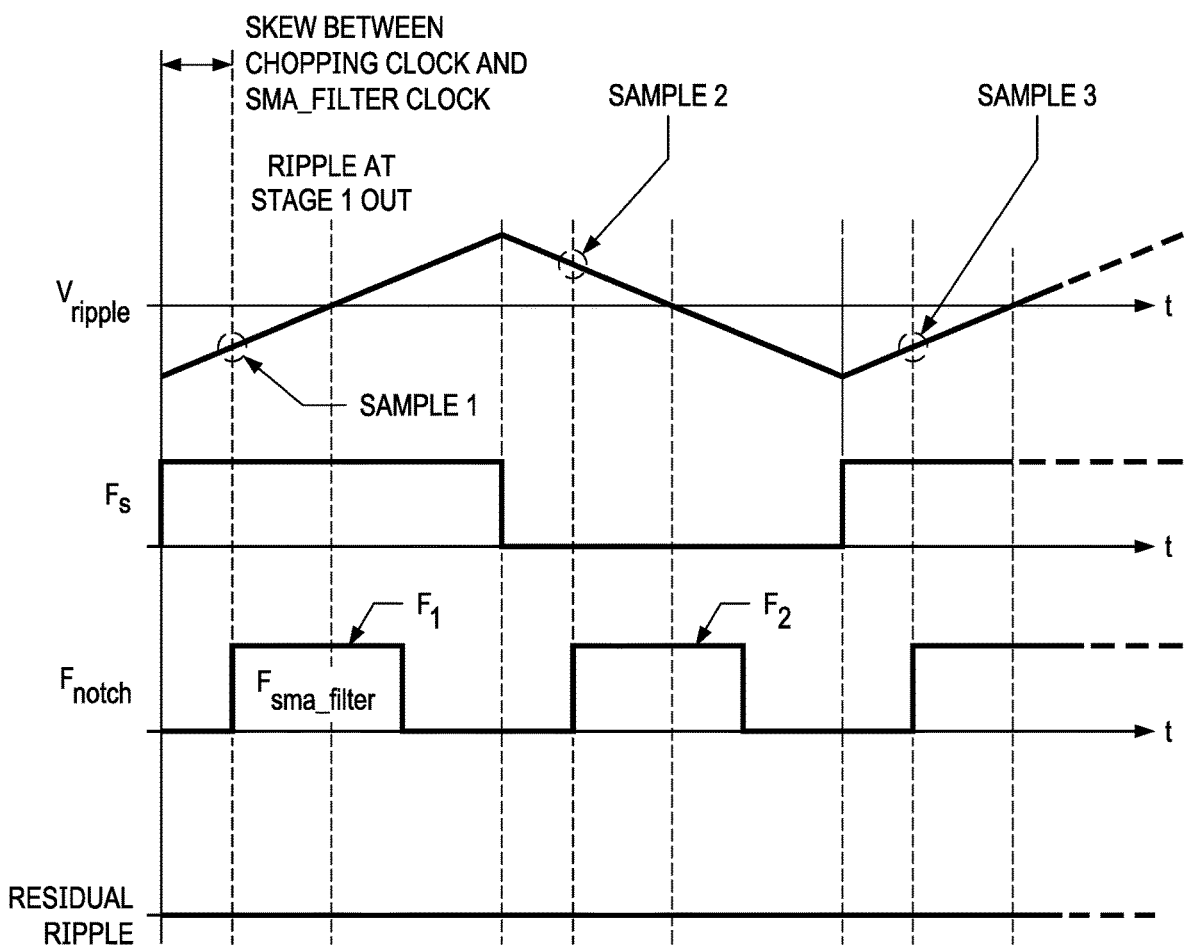

FIG. 3C illustrate ripple voltage at the output of the second chopper circuit 312, clock signals Fs, F1, F2, and residual ripple. As shown in FIG. 3C, a sample and hold function from one point (e.g., sample 1) to the next point (e.g., sample 2) will result in a consistent output, suppressing the ripple when the outputs of the second and third transconductance amplifiers 324 and 328 are added. Thus, even if there is a skew between Fs and F1 or F2, the error sampled by the second transconductance amplifier 324 is canceled by the error sampled by the third transconductance amplifier 328. Thus, the amplifier 300 is tolerant towards clock skew between the chopping clock and the notch filter clock. This is advantageous because in high frequency chopping clock skew errors become significant compared to low frequency chopping.

In one aspect, the second and third transconductance amplifiers 324 and 328 having their outputs connected at the junction 326 operate as a sampled moving average notch filter 344. The sampled moving average notch filter 344 is formed by sampling the in phase component by the transconductance amplifier 324 and the out of phase component by the transconductance amplifier 328, and adding the outputs of the transconductance amplfiers 324 and 328 at the junction 326. The zeroes Fz of the sampled moving average notch filter 344 may be expressed by the relationship Fz=nFs. Hence, the sampled moving average notch filter 344 produces notches at multiples of the chopping frequency Fs. Since the samples are acquired in-phase and out of phase relative to the chopping clock signal Fs, F1 and F2 can be generated using Fs. A higher clock frequency allows the implementation of the sampled moving average notch filter 344 on a smaller area on an integrated circuit.

The skew between Fs and F1 should be same as the skew between Fs and F2 for the error to cancel. If the skew between Fs and F1 is different than the skew between Fs and F2, a DC offset voltage is produced at the output of the notch filter 344 which is turn in attenuated by the gain of the transconductance amplifier 308.

Figure 3D:
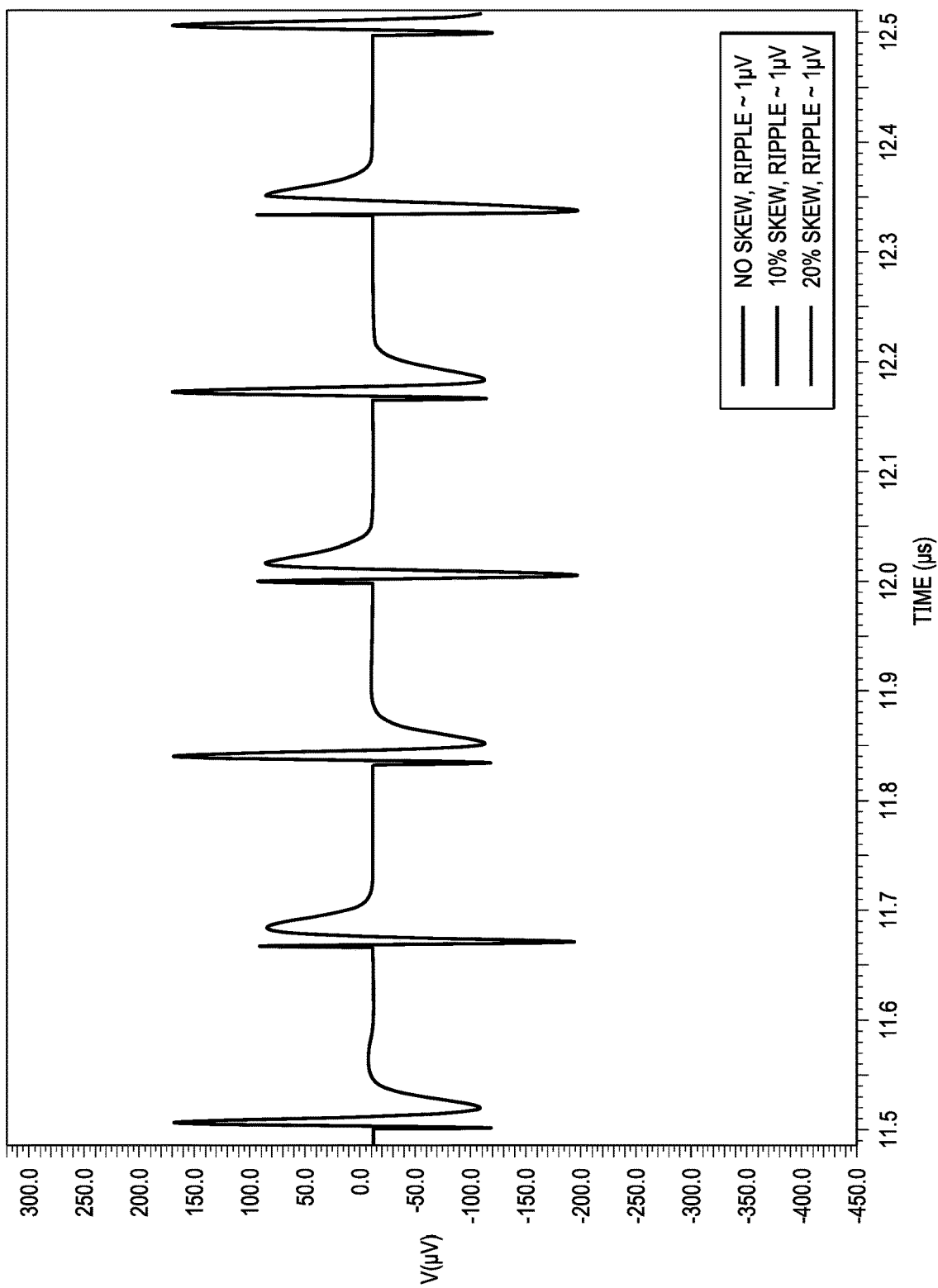

FIG. 3D illustrates performance of the amplifier 300. As shown in FIG. 3D, the ripple voltage is approximately 1 μV regardless of a skew between Fs and F1 or F2. Even in the presence of offset voltages, the second and third transconductance amplifiers 324 and 328 functioning as a moving average sample and hold notch filter cancel the ripple.

In some embodiments, the amplifier 300 can be implemented in an integrated circuit (IC) or in an application-specific integrated circuit (ASIC) system-on-a-chip (SoC). In other embodiments, the amplifier 300 can be implemented with discrete components.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. A chopper-stabilized amplifier comprising:
   a first transconductance amplifier;
   a first chopper circuit coupled to an input of the first transconductance amplifier, the first chopper circuit configured to chop an input signal to apply the chopped input signal to the input of the first transconductance amplifier;
   a second chopper circuit coupled to an output of the first transconductance amplifier and configured to chop an output of the first transconductance amplifier to produce a second chopped signal;
   first and second capacitors coupled between an output of the second chopper circuit and ground;
   a second transconductance amplifier having an input coupled to receive the second chopped signal and operable to produce an output responsive to a first notch clock signal having a first phase relative to the chopping of the second chopper circuit; and
   a third transconductance amplifier having an input coupled to receive the second chopped signal and operable to produce an output responsive to a second notch clock signal having a second phase relative to the first phase,
   wherein output signals produced by the second and third transconductance amplifiers are added to filter ripple noise at the outputs of the second and third transconductance amplifiers.

2. The chopper-stabilized amplifier of claim 1, wherein the second phase is 180 degrees out of phase with the first phase.

3. The chopper-stabilized amplifier of claim 1, wherein the first and second chopper circuits are operated synchronously.

4. The chopper-stabilized amplifier of claim 1 further comprising:
   a fourth transconductance amplifier having an input coupled to receive the outputs of the second and third transconductance amplifiers; and
   a compensation capacitor coupled between the input and output of the fourth transconductance amplifier.

5. The chopper-stabilized amplifier of claim 1 further comprising a fifth transconductance amplifier having an input coupled to receive the input signal and an output coupled to the input of the fourth transconductance amplifier.

6. A chopper-stabilized amplifier comprising:
   a first transconductance amplifier;
   a first chopper circuit coupled to an input of the first transconductance amplifier, the first chopper circuit configured to chop an input signal to apply the chopped input signal to the input of the first transconductance amplifier;
   a second chopper circuit coupled to an output of the first transconductance amplifier and configured to chop an output of the first transconductance amplifier to produce a second chopped signal;
   first and second capacitors coupled between an output of the second chopper circuit and ground;
   a sampled moving average notch filter having differential inputs coupled to receive the second chopped signal and operable to produce a first output responsive to a to a first notch clock signal having a first phase relative to the chopping of the second chopper circuit and a second output responsive to a second notch clock signal having a second phase relative to the first phase, wherein the first and second outputs are added to filter ripple voltages at the outputs of the sampled moving average notch filter.

7. The chopper-stabilized amplifier of claim 6, wherein the sampled moving average notch filter further comprises:
   a second transconductance amplifier having differential inputs coupled to receive the second chopped signal and operable to produce the first output responsive to the first notch clock signal; and
   a third transconductance amplifier having differential inputs coupled to receive the second chopped signal and operable to produce the second output responsive to a second notch clock signal.

8. The chopper-stabilized amplifier of claim 7, wherein the second phase is 180 degrees out of phase with the first phase.

9. The chopper-stabilized amplifier of claim 7, wherein the first and second chopper circuits are operated synchronously.

10. The chopper-stabilized amplifier of claim 7 further comprising:

a fourth transconductance amplifier having an input coupled to receive the outputs of the second and third transconductance amplifiers; and a compensation capacitor coupled between the input and output of the fourth transconductance amplifier.

11. The chopper-stabilized amplifier of claim 7 further comprising:
a fifth transconductance amplifier having an input coupled to receive the input signal and an output coupled to the input of the fourth transconductance amplifier.

12. A chopper-stabilized amplifier comprising:
a first transconductance amplifier;
a first chopper circuit coupled to an input of the first transconductance amplifier, the first chopper circuit coupled to receive an input signal and configured to chop the input signal to apply the chopped input signal to the input of the first transconductance amplifier;
a second chopper circuit coupled to receive an output signal from the first transconductance amplifier and configured to chop the output signal to produce a second chopped signal;
first and second capacitors coupled between an output of the second chopper circuit and ground;
a second transconductance amplifier having an input coupled to receive the second chopped signal and operable to produce an output responsive to a first notch clock signal having a zero degree phase relative to the chopping of the second chopper circuit; and
a third transconductance amplifier having an input coupled to receive the second chopped signal and operable to produce an output responsive to a second notch clock signal having 180 degrees phase relative to the first notch clock signal, wherein output signals produced by the second and third transconductance amplifiers are added to filter ripple voltages at the outputs of the second and third transconductance amplifiers;
a fourth transconductance amplifier having an input coupled to receive the outputs of the second and third transconductance amplifiers;
a compensation capacitor coupled between the input and output of the fourth transconductance amplifier; and
a fifth transconductance amplifier having an input coupled to receive the input signal and an output coupled to the input of the fourth transconductance amplifier.

13. The chopper-stabilized amplifier of claim 12, wherein the first and second chopper circuits are operated synchronously.

* * * * *